(12) United States Patent
Heikkilä et al.

(10) Patent No.: US 7,262,577 B2
(45) Date of Patent: Aug. 28, 2007

(54) METHOD FOR ESTIMATING THE SUM OF STATOR AND ROTOR RESISTANCES

(75) Inventors: Samuli Heikkilä, Helsinki (FI); Mikko Vertanen, Espoo (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 11/408,030

(22) Filed: Apr. 21, 2006

(65) Prior Publication Data

US 2006/0250106 A1    Nov. 9, 2006

(30) Foreign Application Priority Data

Apr. 22, 2005   (EP) .................................. 05103282

(51) Int. Cl.
*H02P 3/18*    (2006.01)
(52) U.S. Cl. ...................... 318/727; 318/807; 318/812
(58) Field of Classification Search ................ 318/727, 318/798, 805, 807, 812
See application file for complete search history.

(56) References Cited

U.S. PATENT DOCUMENTS

| 5,969,498 | A  | * | 10/1999 | Cooke ......................... 318/799 |
| 6,327,524 | B1 | * | 12/2001 | Chen .......................... 701/22 |
| 6,636,012 | B2 | * | 10/2003 | Royak et al. ................ 318/727 |
| 2003/0155885 | A1 | * | 8/2003 | Zaremba et al. ............. 318/727 |
| 2005/0029983 | A1 | * | 2/2005 | Mijalkovic et al. .......... 318/818 |

FOREIGN PATENT DOCUMENTS

| EP | 0 704 709 A2 | 4/1996 |
| EP | 0 924 852 A2 | 6/1999 |

OTHER PUBLICATIONS

Collins E R Jr et al: "Improved methods for determining the equivalent circuit parameters for single-phase induction motor models" pp. 390-397 Oct. 2, 1993.
Chen TC et al: "Measurement of induction 1 motor parameter identification" pp. 288-291, vol. Conf. 8 May 14, 1991.

* cited by examiner

*Primary Examiner*—Rina Duda
(74) *Attorney, Agent, or Firm*—Buchanan Ingersoll & Rooney PC

(57) ABSTRACT

A method for estimating the sum of the stator and rotor resistances of an induction machine using a frequency converter when the frequency converter is connected to the induction machine. The method comprises the steps of controlling the stator current of the induction machine with the frequency converter such that the rotor flux ($\psi_R$) changes substantially linearly while the stator current is substantially constant, determining the magnitude of stator voltage and stator current while the rotor flux is changing substantially linearly, and calculating the sum of the stator and rotor resistances from the determined magnitudes of stator voltage and stator current.

11 Claims, 2 Drawing Sheets

METHOD FOR ESTIMATING THE SUM OF STATOR AND ROTOR RESISTANCES

BACKGROUND OF THE INVENTION

The invention relates to a method for estimating the sum of the stator and rotor resistances of an induction machine. More specifically, the invention relates to a method, which can be used to estimate the sum of said resistances during the DC-magnetization period of the induction machine.

In a plurality of control methods, the essential parameters of the induction machine are needed for reliable and accurate control. These required parameters include inductances and resistances of the machine. Resistance values are needed in control methods that use tachometer and also in drives without a tachometer. In drives without a tachometer, the importance of rotor resistance estimate depends greatly on the method by which the flux of the machine is estimated. The induction machine manufacturer also gives some estimates for the rotor resistance either directly or indirectly, but these values are known to be somewhat inaccurate for reliable control.

The measurement of stator resistance is easily accomplished, but since the stator and the rotor have no galvanic connection between them, the measurement of rotor resistance is not a straightforward operation. There are multiple known methods for estimation of the rotor resistance either on-line or off-line. One on-line method is presented in Atkinson D. J., Finch J. W, and Acarnley P. P., 1996 "Estimation of rotor resistance in induction motors", IEE Proceedings on Electrical power Applications, vol. 143, no. 1, pp. 87-94.

However, finding a reliable estimate for rotor resistance has appeared to be a difficult task.

BRIEF DESCRIPTION OF THE INVENTION

It is an object of the present invention to provide a method that avoids the above-mentioned drawbacks and enables calculation of the sum of the stator and the rotor resistances more reliably than before using a simple method. This object is achieved by a method of the invention that is characterized by what is stated in independent claim 1.

The invention is based on the idea that the sum of the stator and rotor resistances is calculated from the measured stator current and stator voltage, which are measured at certain circumstances that enable the simple calculation of the mentioned sum. In these circumstances, the stator current is held constant and the rotor flux changes linearly. After the sum of the resistances has bee calculated, the rotor resistance can be easily calculated by first calculating the stator resistance and then subtracting it from the calculated sum.

The method of the invention requires neither additional measurements nor complicated algorithms for achieving the reliable estimate for the sum of the resistances, which resistance values are again used as model parameters in control systems used to control the induction machine. The method of the invention thus enables reliable control of induction machines by giving accurate estimates of the rotor and stator resistances.

BRIEF DESCRIPTION OF THE FIGURES

The invention will now be described in more detail by means of preferred embodiments and with reference to the attached drawings, in which.

DETAILED DESCRIPTION OF THE INVENTION

Figure 1:
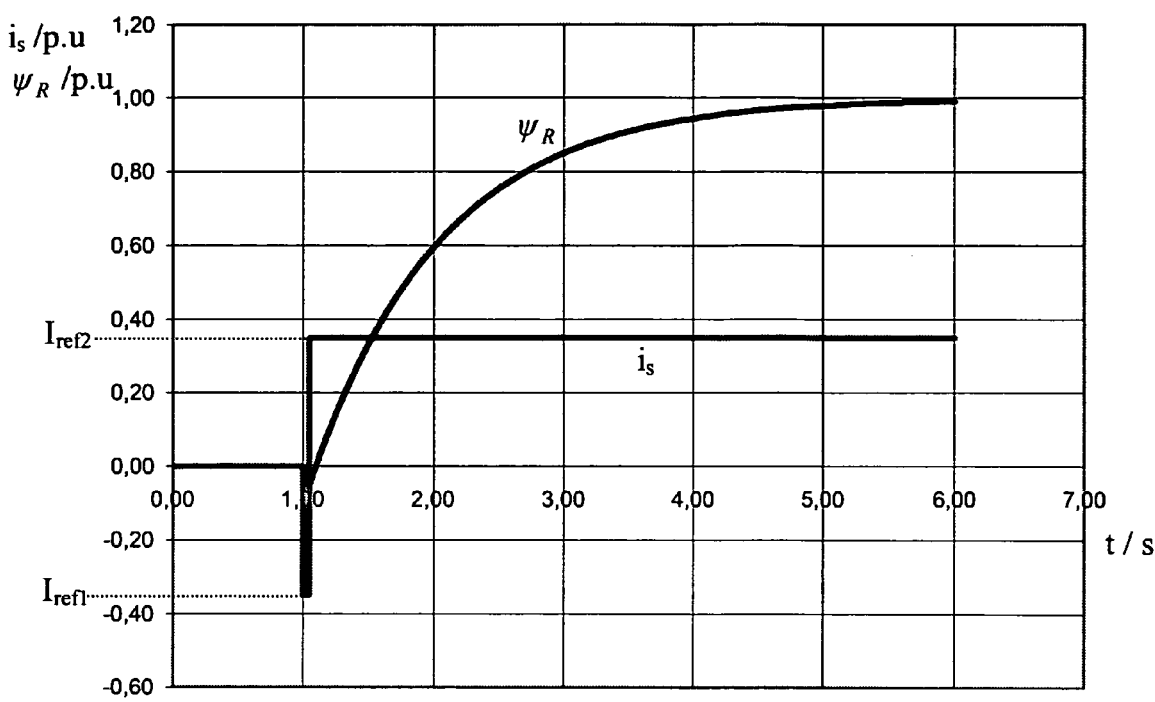
FIG. 1 shows the stator current and rotor flux waveforms according to one preferred embodiment.

The present invention provides a method which can be used to calculate or estimate the sum of the stator and rotor resistances of an induction machine at zero frequency, i.e. when the rotor is not rotating. As stated above, the stator resistance can be calculated accurately, and the method thus enables the calculation of the rotor resistance.

The method of the invention is based on the mathematical model of the induction machine and here it is described in connection with a known L-equivalent circuit and its differential equations $$\dot{\psi}_s = u_s - R_s i_s \quad (1)$$

$$\dot{\psi}_R = R_R i_s - \frac{1}{\tau_r}\psi_R + j\omega_m \psi_R \quad (2)$$

and the equation binding equations (1) and (2) together $$\psi_R = \psi_s - \sigma L_s i_s. \quad (3)$$

In the equations
$\psi_s$ is stator flux vector,
$\psi_R$ is rotor flux vector,
$i_s$ is stator current vector,
$u_s$ is stator voltage vector,
$R_s$ is stator resistance,
$R_R$ is rotor resistance,
$\sigma L_s$ is stator stray inductance,
$\tau_r = L_M/R_R$ is rotor time constant,
$L_M$ is main inductance and
$\omega_m$ is angular speed.

Because the method of the invention is to be used at zero speed during DC-magnetization, the vector quantities can be replaced by corresponding scalar quantities. By inserting equation (1) and the derivative of (3) into equation (2) one obtains:

$$\dot{\psi}_R = R_R i_s - \frac{1}{\tau_r}\psi_R = \dot{\psi}_s - \sigma L_s \dot{i}_s = u_s - R_s i_s - \sigma L_s \dot{i}_s. \quad (4)$$

Further by solving the sum the stator and rotor resistances one obtains:

$$R_s + R_R = \frac{u_s + \psi_R/\tau_r - \sigma L_s \dot{i}_s}{i_s}. \quad (5)$$

During the DC-magnetization, the stator voltage and stator current present in equation (5) can be measured easily and are thus known quite accurately. The dependence on stray inductance and on stator current derivative can be dealt with by keeping the stator current constant so that the stator current derivative is zero. Another term that cannot be directly measured is the term rotor flux per rotor time constant $\psi_R/\tau_r$. Since the rotor time constant is $\tau_r=L_M/R_R$, the rotor resistance is in fact also present in the right side of equation (5).

Figure 2:
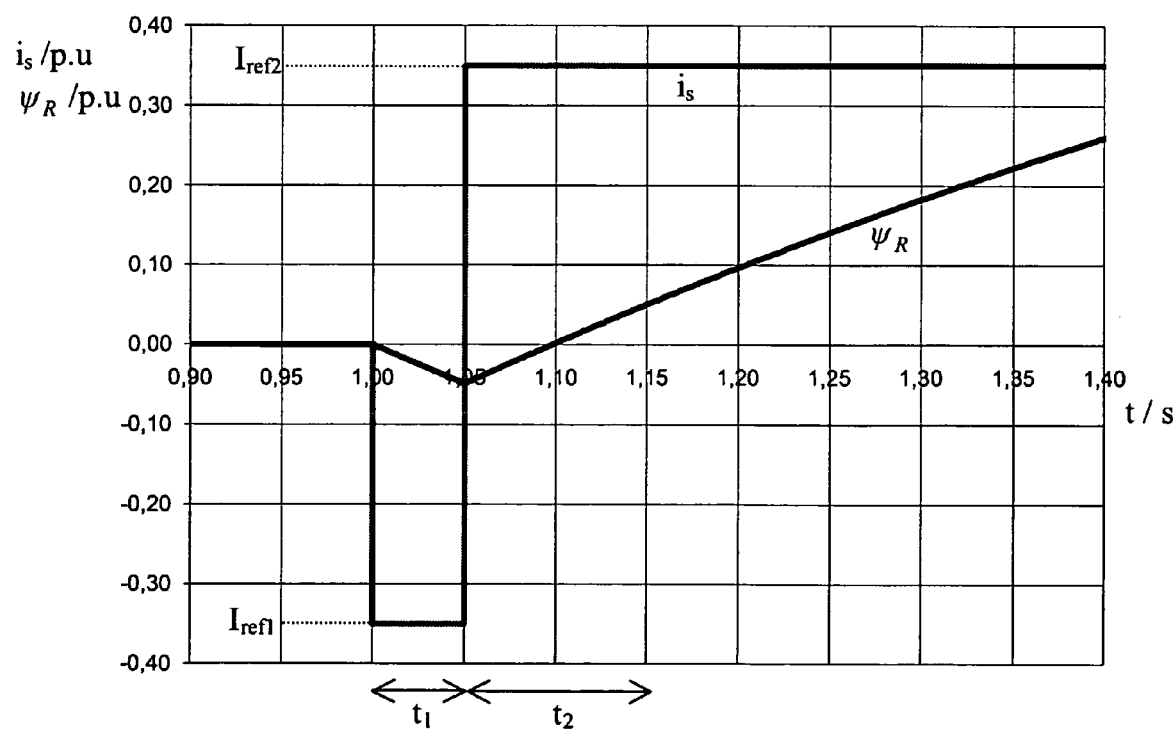
FIG. 2 shows a detailed view of waveforms of FIG. 1.

FIG. 1 illustrates the DC-magnetization according to the method of the invention. In FIG. 1, the dynamics of a first-order low-pass filter is presented, which corresponds to the dynamics of the rotor flux. FIG. 2 is an enlargement of the interesting time period of FIG. 1. At the time instant 1s stator current is set to first reference value $I_{ref1}$. The rotor flux starts to grow linearly in the negative direction. At the time instant 1.05 s, the stator current is turned to positive direction and to value $I_{ref2}$, and the rotor flux turns to grow linearly in the positive direction. During the time interval 1.05 s . . . 1.15 s, the rotor flux grows linearly and is in practice so symmetric that the average value of the flux is approximately zero. When equation (5) is applied during this period, the derivative of the current is zero and the rotor flux is also approximately zero. This leaves only the measurements of current and voltage in equation (5). In practice, the current and voltage are averaged at the mentioned period, which minimizes the influence of possible disturbances in the measurements.

Since the change of current from the lower value to the higher value requires in practice at least a couple of hundreds of microseconds and since the stator current has to be constant during the measurements, this period of current change has to be extracted from the calculation. This means that the practical transient free symmetrical calculation period in the case of FIG. 1 would be from 1.07 s to 1.13 s.

In the method of the invention, the stator current is thus controlled such that the rotor flux changes linearly while the stator current is constant. The measurements of stator voltage and stator current are carried out during that period. The sum of the stator and rotor resistance is then calculated as $$R_s + R_R = \frac{u_s}{i_s}. \quad (6)$$

As mentioned above, the stator current and stator voltage are measured at a high sampling frequency to achieve a plurality of measured values. From these measurements, average values are calculated and then used in equation (6) for the calculation of the sum.

By using the above method, the rotor flux term is eliminated from equation (5). In order for the assumption for symmetric rotor flux to hold in the calculation period, the period must be at least shorter than one decade of the filter time constant of the first-order low-pass filter, i.e. of the rotor time constant. Typically in the induction machines of over 1 kW the rotor time constants vary from 100 ms to 2 s. This means that the calculation periods should be from 5 ms to 100 ms at the maximum. On the other hand, the calculation period should be long enough to allow for reliable averaged measurements from the stator current and voltage. In practice, a couple of milliseconds should be enough, when the modulation period is much shorter. Even if the rotor flux were almost zero, it could be taken into account together with the rotor time constant in equation (5).

It is also possible to use different amplitudes for the positive and negative current pulses. The zero-averaged rotor flux is obtained by controlling the current so that the area of the second current pulse (i.e. time integral) is twice the area of the first current pulse. In the FIGS. 1 and 2, the current amplitudes are equal ($I_{ref1}=-I_{ref2}$) and the minimum time for the positive pulse is thus twice the pulse duration of the negative pulse ($t_2=t_1\times2$). In the FIGS. 1 and 2, the second pulse is kept up over the minimum period to illustrate the change of the rotor flux. The minimum time for the second pulse (i.e. the calculation period) is thus dependent on the time integral of the first pulse such that the pulse time of the second pulse multiplied by the amplitude of the pulse should be at least two times the pulse time of the first pulse multiplied by the pulse amplitude.

The above embodiment of the invention can also be used in connection with an ordinary start using DC-magnetization. The sum of the stator and rotor resistances can be used to approximate the warming up of the machine. Although stator and rotor may warm up at slightly different rates, the information can be used to adapt stator and rotor resistances separately, since the ratio between them has been measured using a cold machine during identification drive. Since the method of the invention requires only a short time, it does not disturb the user and the method can be carried out so that the user does not even notice it.

Figure 3:
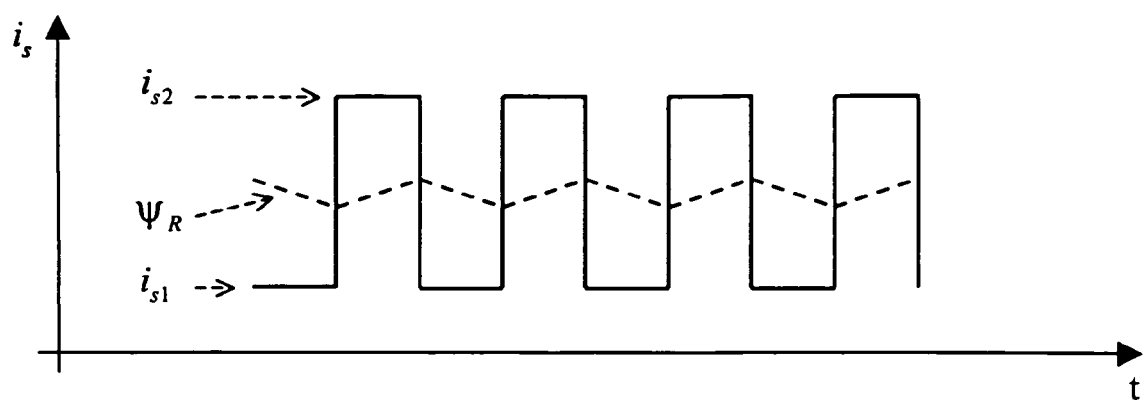
FIG. 3 shows the stator current and rotor flux waveform according to another preferred embodiment.

FIG. 3 shows stator current and rotor flux waveforms according to another preferred embodiment of the present invention. In this embodiment, during DC-magnetization a zero-averaged pulsed current is injected into the stator current as seen in FIG. 3. The pulse width of the pulsed current is selected to be such that during one half-cycle the change of the rotor flux is in practice linear. A suitable length for the pulse is for example $\tau_r/10$ or smaller. The pulsed current does not necessarily have to be symmetric, but to avoid starting transients, it is worth selecting the first half-cycle to be half the normal length.

According to a preferred embodiment, the amplitude of the pulsed current is selected to be as high as possible such that the sign of the current does not change.

In a dynamic situation the stator voltage is $$u_s = (R_s + R_R)i_s + \sigma L_s \frac{di_s}{dI} - \frac{\psi_R}{\tau_r}, \quad (7)$$

which is equivalent to equation (5) above.

When during the successive half-cycles the average stator voltages are measured in a situation where the derivative of the stator current is zero, then the following equations hold for the voltages $$\text{Negative half-cycle } u_{s,ave1} = (R_s + R_R)i_{s1} - \frac{\psi_{R,ave1}}{\tau_r}$$

$$\text{Positive half-cycle } u_{s,ave2} = (R_s + R_R)i_{s2} - \frac{\psi_{R,ave2}}{\tau_r}$$

Since the change of the rotor flux during the rising and falling edges of the current is negligible, and since the change of the rotor flux during each half-cycle of the pulsed current is practically linear, the following approximation holds:

$$\psi_{R,ave1} \approx \psi_{R,ave2} \quad (8)$$

This approximation also holds for asymmetric pulses. It is satisfactory that both the half-cycles are short enough so that the change of the rotor flux can be considered to be linear.

When the averaged voltages $u_{s,ave1}$ and $u_{s,ave2}$ are subtracted from each other, one can eliminate the rotor flux and rotor time constant dependent term $\psi_R/\tau_r$. The rotor sum of rotor and stator resistances can then be calculated from $$R_R + R_S = \frac{u_{s,ave2} - u_{s,ave1}}{i_{s2} - i_{s1}}. \qquad (9)$$

It should be noted that in the embodiment above the possible remanence flux of the machine does not affect the accuracy of the estimate. This is due to the fact that the rotor flux is close to its nominal value during the measurement. This can be taken care of with the preferred embodiment of the invention, where the average stator current is substantially equal to the nominal magnetization current.

According to a still preferred embodiment of the invention, the current injection is carried out repeatedly, i.e. so that the injected signal comprises multiple pulse periods as in FIG. 3. This is to improve the accuracy of the estimation. If the injected signal comprises n periods, each averaged voltage $u_{s,ave1}$ and $u_{s,ave2}$ can be summed and the sum of stator and rotor resistances can be calculated from $$R_R + R_s = \frac{\sum_{i=1}^{n} u_{s,ave2,i} - \sum_{i=1}^{n} u_{s,ave1,i}}{n(i_{s2} - i_{s1})} \qquad (10)$$

In the above equation, each averaged voltage measured during a positive half-cycle of signal of n periods is summed together and similarly each averaged voltage measured during negative half-cycle is summed together. These sums are then subtracted and the result is divided by the difference between the higher and lower current multiplied by n.

The method of the invention requires that the current controller of the frequency converter should be fast and stable, so that the level change of the currents ($i_{s1} \rightarrow i_{s2}$, $i_{s2} \rightarrow i_{s1}$ and $I_{ref1} \rightarrow I_{ref2}$) and the transient associated with it would be as short as possible. In practice, a hysteris or deadbeat controller is needed, especially when the rotor time constant is small. For that reason, the current pulses have to be very narrow so that the changes in the rotor flux will be linear.

In the above, the method of the invention is used to estimate the sum of stator and rotor resistances. If the stator resistance is already known, the rotor resistance can be simply calculated from the result of the present method. It is a well-known fact that the stator resistance can be determined during dc-magnetization, when stator voltage, stator current and rotor flux are constants.

In measuring the stator current and voltage, an average of the values is formed. The measurement is performed by sampling the current and voltage at a high frequency. After the measurement period, an average is formed by summing the samples and dividing the sum by the number of samples.

It is obvious to a person skilled in the art that while technology advances, the basic idea of the invention can be implemented in many different ways. The invention and its embodiments are thus not restricted to the examples described above, but can vary within the scope of the claims.

The invention claimed is:

1. A method for estimating the sum of the stator and rotor resistances of an induction machine using a frequency converter when the frequency converter is connected to the induction machine, the method comprising the steps of controlling the stator current of the induction machine with the frequency converter such that the rotor flux ($\psi_R$) changes substantially linearly while the stator current is substantially constant, determining the magnitude of stator voltage and stator current while the rotor flux is changing substantially linearly, and calculating the sum of the stator and rotor resistances from the determined magnitudes of stator voltage and stator current.

2. A method according to claim 1, wherein the controlling of the stator current comprises the steps of controlling the stator current to the first reference value ($I_{ref1}$) for a first time period ($t_1$) so that the rotor flux starts to grow in the direction of the current, controlling the stator current to the second reference value ($I_{ref2}$) for a second time period ($t_2$) so that the rotor flux starts to grow in the direction of the current, whereby preferably $I_{ref2} > 0$, $i_{ref1} = -i_{ref2}$ and $t_2 = 2 \times t_1$.

3. A method according to claim 1, wherein the magnitudes of stator voltage and stator current are determined during a period in which the average value of the rotor flux is substantially zero.

4. A method according to claim 1, wherein the sum of the stator and rotor resistances is calculated by calculating an average of the stator voltage and an average of the stator current during the period in which the rotor flux is substantially zero and dividing the average stator voltage by the average stator current.

5. A method according to claim 1, wherein the controlling of the stator current comprises the steps of controlling a DC-current to the stator of the induction machine and, inserting a square pulse current into the stator current of the induction machine using the frequency converter, the pulse current having an amplitude ($i_{s2} - i_{s1}$).

6. A method according to claim 1, wherein the magnitudes of stator voltage and stator current are determined during periods in which the average value of the rotor flux is substantially equal during consecutive positive and negative pulses.

7. A method according to claim 6, wherein the determining of the magnitude of stator voltage comprises steps of:

determining the stator voltage ($u_{s,ave1}$) of the induction machine during the square pulse when the stator current is at the first amplitude ($i_{s1}$), and determining the stator voltage ($u_{s,ave2}$) of the induction machine during the square pulse when the stator current is at the second amplitude ($i_{s2}$).

8. A method according to claim 5, wherein the sum of the stator and rotor resistances is calculated by:

calculating a difference between stator voltages ($u_{s,ave2} - u_{s,ave1}$) that are determined when the stator current is at the first amplitude and second amplitude, and dividing said difference of the voltages by the amplitude of the pulsed current ($i_{s2} - i_{s1}$).

9. A method according to claim 5, wherein the determined stator voltages ($u_{s,ave1}$, $u_{s,ave2}$) are average voltages of the measurement period.

10. A method according to claim 5, wherein the step of inserting square pulse current into the stator current comprises a step in which multiple n consecutive square pulses are injected into the stator current, whereby the sum of the stator and rotor resistances is calculated by calculating the sum of stator voltages $$\sum_{i=1}^{n} u_{s,ave1,i}$$

determined when the stator current is at the first amplitude ($i_{s1}$) during consecutive pulses,
calculating the sum of stator voltages $$\sum_{i=1}^{n} u_{s,ave2,i}$$

determined when the stator current is at the second amplitude ($i_{s2}$) during consecutive pulses,
subtracting the sum of the stator voltages $$\sum_{i=1}^{n} u_{s,ave1,i}$$

determined at the first amplitude from the sum of the stator voltages $$\sum_{i=1}^{n} u_{s,ave2,i}$$

determined at the second current amplitude, and
dividing the subtraction result by the number of consecutive pulses n and by the amplitude of the pulsed current ($i_{s2}-i_{s1}$).

11. A method according to claim 5, wherein the stator DC-current, into which the pulsed current is injected, has a magnitude that is substantially equal to the nominal magnetization current.

* * * * *